(12) United States Patent
Krehbiel, Jr. et al.

(10) Patent No.: US 6,704,810 B1
(45) Date of Patent: Mar. 9, 2004

(54) METHOD FOR HANDLING PERSISTENT RESERVATION REGISTRATIONS IN A STORAGE DEVICE

(75) Inventors: Stanley E. Krehbiel, Jr., Wichita, KS (US); David J. Ulrich, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 2 days.

(21) Appl. No.: 10/231,331

(22) Filed: Aug. 27, 2002

(51) Int. Cl.[7] .............................................. G06F 13/00
(52) U.S. Cl. ................... 710/5; 710/19; 710/58; 712/217; 713/2; 713/300
(58) Field of Search ........................ 710/5–7, 15–19, 710/20–21, 58–61; 712/216–219; 711/141, 164; 713/2, 300

(56) References Cited

U.S. PATENT DOCUMENTS

| | | | | |
|---|---|---|---|---|
| 5,644,786 A | * | 7/1997 | Gallagher et al. | 710/30 |
| 5,835,714 A | * | 11/1998 | Herzl et al. | 709/208 |
| 5,953,510 A | * | 9/1999 | Herzl et al. | 710/107 |
| 6,223,243 B1 | * | 4/2001 | Ueda et al. | 710/244 |
| 6,298,428 B1 | * | 10/2001 | Munroe et al. | 711/202 |
| 6,393,539 B1 | * | 5/2002 | Nguyen et al. | 711/164 |
| 6,532,538 B1 | * | 3/2003 | Cronk et al. | 713/2 |
| 6,654,902 B1 | * | 11/2003 | Brunelle et al. | 714/4 |
| 6,658,587 B1 | * | 12/2003 | Pramanick et al. | 714/5 |

FOREIGN PATENT DOCUMENTS

| EP | 1321848 A2 | * | 6/2003 | G06F/3/06 |
|---|---|---|---|---|

* cited by examiner

*Primary Examiner*—Christopher B. Shin
(74) *Attorney, Agent, or Firm*—The Law Offices of William W. Cochran, LLC

(57) ABSTRACT

Persistent reservations may be processed on an as-needed basis after a power cycle sequence. A computer storage device may have persistent reservations for various volumes that are to be deleted after a power cycle but before accepting any reservation I/O requests for those volumes. After a start up sequence, the device comes on-line prior to deleting the required registrations. Prior to the first reservation I/O request for the particular volume, the registrations are processed for that volume and the necessary registrations are deleted.

8 Claims, 3 Drawing Sheets

| 202 Normal Operating Conditions | Volume ID 204 | Remove After Power On Bit 206 | Power Up 208 | Registration List 210 |
|---|---|---|---|---|
| | 1 | True | False | Populated |
| | 2 | False | False | Populated |
| | 3 | True | False | Populated |

| 212 Immediately After Startup | Volume ID 214 | Remove After Power On Bit 216 | Power Up 218 | Registration List 220 |
|---|---|---|---|---|
| | 1 | True | True | Populated |
| | 2 | False | False | Populated |
| | 3 | True | True | Populated |

| 222 First I/O Request to Volume 3 | Volume ID 224 | Remove After Power On Bit 226 | Power Up 228 | Registration List 230 |
|---|---|---|---|---|
| | 1 | True | True | Populated |
| | 2 | False | False | Populated |
| | 3 | True | False | New Data |

FIGURE 2

METHOD FOR HANDLING PERSISTENT RESERVATION REGISTRATIONS IN A STORAGE DEVICE

BACKGROUND OF THE INVENTION a. Field of the Invention

The present invention pertains generally to disk storage devices and specifically to the management of reservations with disk storage devices.

b. Description of the Background

Reservations are used in storage devices for allowing only certain users or computers to execute commands to the devices. For example, a reservation may allow certain users, also known as an initiator port or host, to read or write to a volume on a device. In some cases, a host may be given exclusive permission to write to a volume while several other hosts may be given permission to read the volume.

Persistent reservations are a way for hosts to reserve space on a storage device in a way that the reservation can survive a reset or a power cycle. In order for a storage device to support this type of activity, it must make certain information persistent. In some instances, persistent reservations may be required to survive a reset but not a power cycle. Such reservations must therefore be processed and deleted or removed when the power cycle occurs.

For a reservation to be set for a particular host, the host must first be registered with the volume. Registration involves logging the particular host with the volume. Such logs of registrations may be quite lengthy and complex in some instances. The commands used for processing registrations may be a subset of the reservation commands. When a reservation is to persist through a reset but not a power cycle, both the reservations and the registrations must be cleared after the power cycle.

When a storage device of this type is reset or powered-on, a great deal of activity occurs in preparing the device for I/O activity. Additionally, the device must be ready to respond to I/O requests within a short time. For a device with 256 volumes and 512 host ports, over 524,000 registrations may need to be managed during the start up period. The time consumed with management of such a large amount of records may be prohibitive when performing a start-of-day routine. Such devices with persistent reservations may be SCSI storage devices such as hard disks or storage systems with removable media such as a disk changer.

It would therefore be advantageous to provide a method for handling a large amount of registrations during a power-on phase of a storage device. It would be further advantageous if the method were able to bring the device into useful service as quickly as possible, while being able to handle large amounts of registration processing.

SUMMARY OF THE INVENTION

The present invention overcomes the disadvantages and limitations of the prior art by providing a device and method for managing a large amount of registrations after restarting the device by processing the registrations on an as-needed basis. As a volume responds to a reservation request for the first time after power-on, the registrations for that volume will be processed in preparation for the first input or output command. Further, during periods of inactivity, volumes that have not been processed may be processed.

The present invention may therefore comprise a method for processing persistent reservations after a power cycle in a computer storage device with multiple volumes comprising: completing a power-on sequence after a power cycle; setting the status of the storage device to receive I/O requests; receiving a reservation I/O request for a volume of the storage device, the volume having ax least one persistent reservation that is to persist through a restart but not a power cycle; determining that a power cycle has occurred and that the reservation is not to persist after the power cycle; performing at least some processing on the reservation; and processing the reservation I/O request.

The present invention may further comprise a computer storage device of multiple volumes with reservations that persist after a reset but not a power cycle comprising: a storage medium comprising multiple volumes; and a controller for the storage device adapted to completing a power-on sequence after a power cycle, setting the status of the storage device to receive I/O requests, receiving a reservation I/O request for a volume of the storage device, the volume having at least one persistent reservation that is to persist through a restart but not a power cycle, determining that a power cycle has occurred and that the reservation is not to persist after the power cycle, performing at least some processing on the reservation, and processing the reservation I/O request.

The advantages of the present invention are that the storage device may resume handling of input and output commands quickly after restart. Rather than performing all of the registration processing prior to resuming the first I/O command, little or no registration processing is performed prior to resuming I/O commands. Thus, the device may come on-line as fast as possible. Further, during periods of inactivity after coming on-line, any registration processing that is required for other volumes may be performed, eliminating any processing prior to the first access of those volumes.

BRIEF DESCRIPTION IF THE DRAWINGS

In the drawings,

FIG. 2 is an illustration of an embodiment of the present invention wherein the status of three volumes of a storage device is shown during several phases of startup and operation.

DETAILED DESCRIPTION OF THE INVENTION

Figure 1:
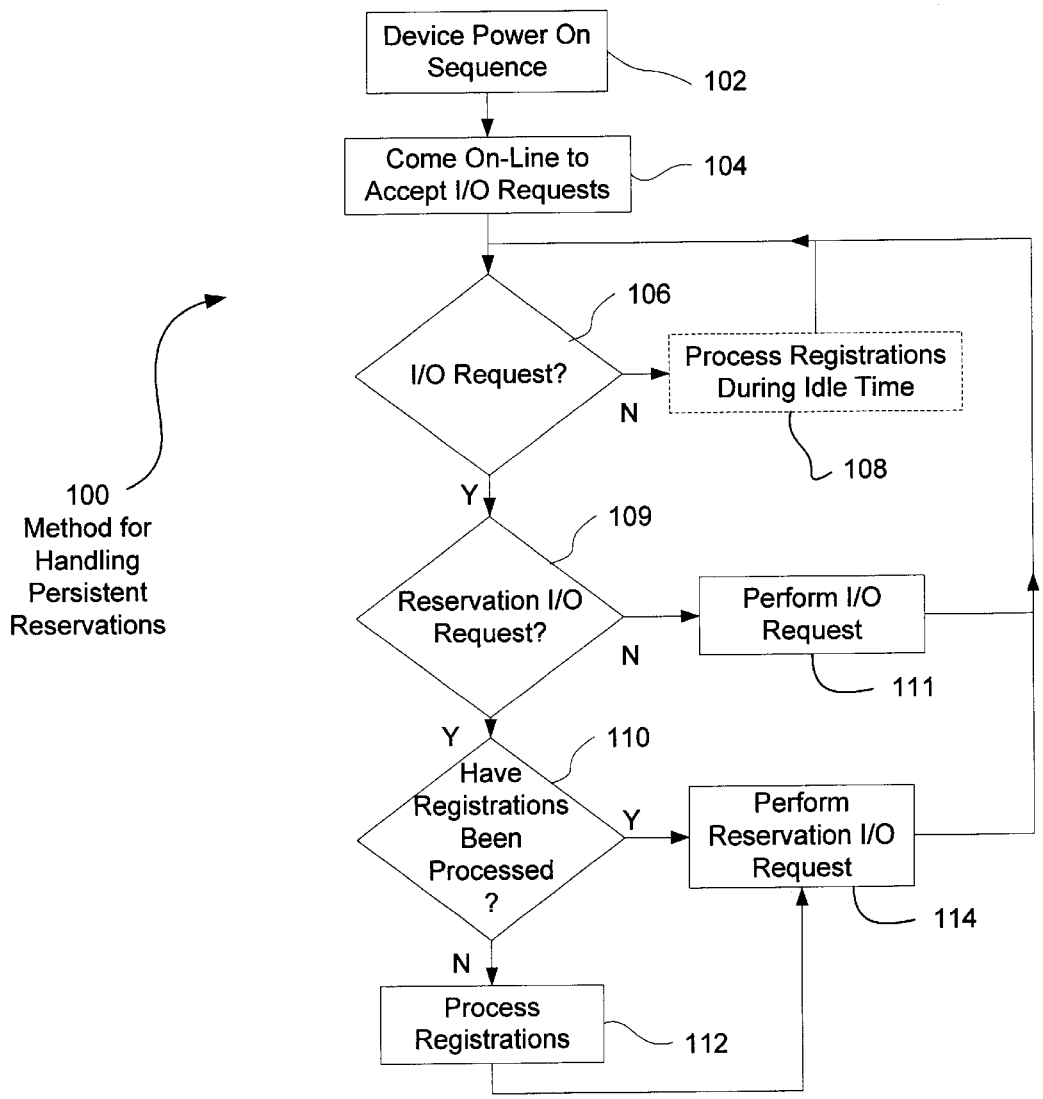
FIG. 1 is an illustration of a work flow diagram of an embodiment of the present invention wherein persistent reservations are handled after the power-on sequence is completed.

FIG. 1 illustrates a work flow diagram of an embodiment 100 of the present invention wherein persistent reservations are handled after the power-on sequence is completed. After the power-on sequence in step 102, the storage device is brought on-line in step 104. If there is no reservation I/O request in step 106, reservations and/or registrations may optionally be processed during idle time in step 108. When an I/O request is received in step 106, and the I/O request is not a reservation request in step 109, the I/O request is processed in step 111. When an I/O request is received in step 106, and the I/O request is a reservation request in step 109, and the reservations and/or registrations for the particular volume has not been processed in step 110, the reservations and/or registrations are processed in step 112 before the reservation I/O request is performed in step 114. If the reservations and/or registrations have already been processed in step 110, the reservation I/O request is performed in step 114.

The embodiment 100 provides a method whereby registrations are processed for each volume when the first reservation I/O request is received for that volume. A reservation I/O request is one that effects the reservation or registration of the particular volume. General I/O requests, such as read and write requests, would be handled as if no reservation exists, since the reservation was not to persist through the power cycle.

During the power on sequence of step 102, the reservation was deleted. However, the registration list, which may be quite lengthy, has not been deleted and other clean-up processing has not occurred.

It is necessary that the registrations be processed before a reservation I/O request is executed. However, to process all of the registrations prior to bringing the device on-line may add considerable time to the startup process. This delay may be substantial, possibly on the order of a few minutes, and may be unacceptable. The embodiment 100 brings the device on-line prior to processing the registrations, and only processes those registrations for each volume as reservation I/O commands are received for that volume. The embodiment 100 essentially spreads the lengthy processing time for the registrations across reservation I/O requests for each individual volume. The processing time for each volume may be a matter of a few seconds, which may be almost unnoticeable. Further, after the initial processing is completed for a volume, the processing will not be required again.

The processing of step 112 may include deleting registrations that do not persist after a power cycle. In addition, cleaning up the database records of the various registrations and reservations associated with the volume may be finalized at this time. Those skilled in the arts may incorporate other volume-specific processing tasks or routines while maintaining within the scope and intent of the present invention.

The embodiment 100 provides a method whereby registrations may be optionally processed during idle time in step 108. This optional processing may allow the registrations of some volumes to be processed after the device is brought on-line. By using idle time after startup to process registrations, the device may be on-line sooner and also avoid the delay of processing of step 112.

FIG. 2 illustrates the status of three volumes of a device during several phases of startup and operation with an embodiment of the present invention. The normal operating conditions 202 of the various volumes 204 are shown. For volumes 1 and 3, the remove after power-on bit 206 is set to true. This means that the reservations for those volumes should be deleted only after cycling the power of the device, but not if a 'warm boot' or reset is performed. The remove after power-on bit 206 is set to false for volume 2. This means that the reservations for volume 2 are to persist even after a complete power cycle. The power up bit 208 is a flag that indicates if the registration list for the particular volume needs to be processed prior to executing a reservation I/O command. The registration list column 210 indicates the status of the registration lists.

Immediately after startup 212, the processing of the registration lists have not occurred. The power up bit 218 for volumes 1 and 3 are set to true, indicating that no reservation I/O requests can be executed until the registration lists 220 are processed. The registration list for volume 2 does not need to be processed, since the remove after power-on bit 216 is set to false. Thus, the power up bit 218 is likewise set to false, indicating that no further processing is necessary.

When a reservation I/O request is received for volume 3 in table 222, the registration list 230 for volume 3 is processed with new data and the power up bit 228 is set to false. At this point, no reservation I/0 requests have been received for volume 1, and thus the power up bit 228 for volume 1 is set to true. When a reservation I/O request is received for volume 1, the registration list 230 would be processed and the status would return to normal operating conditions 202.

Figure 3:
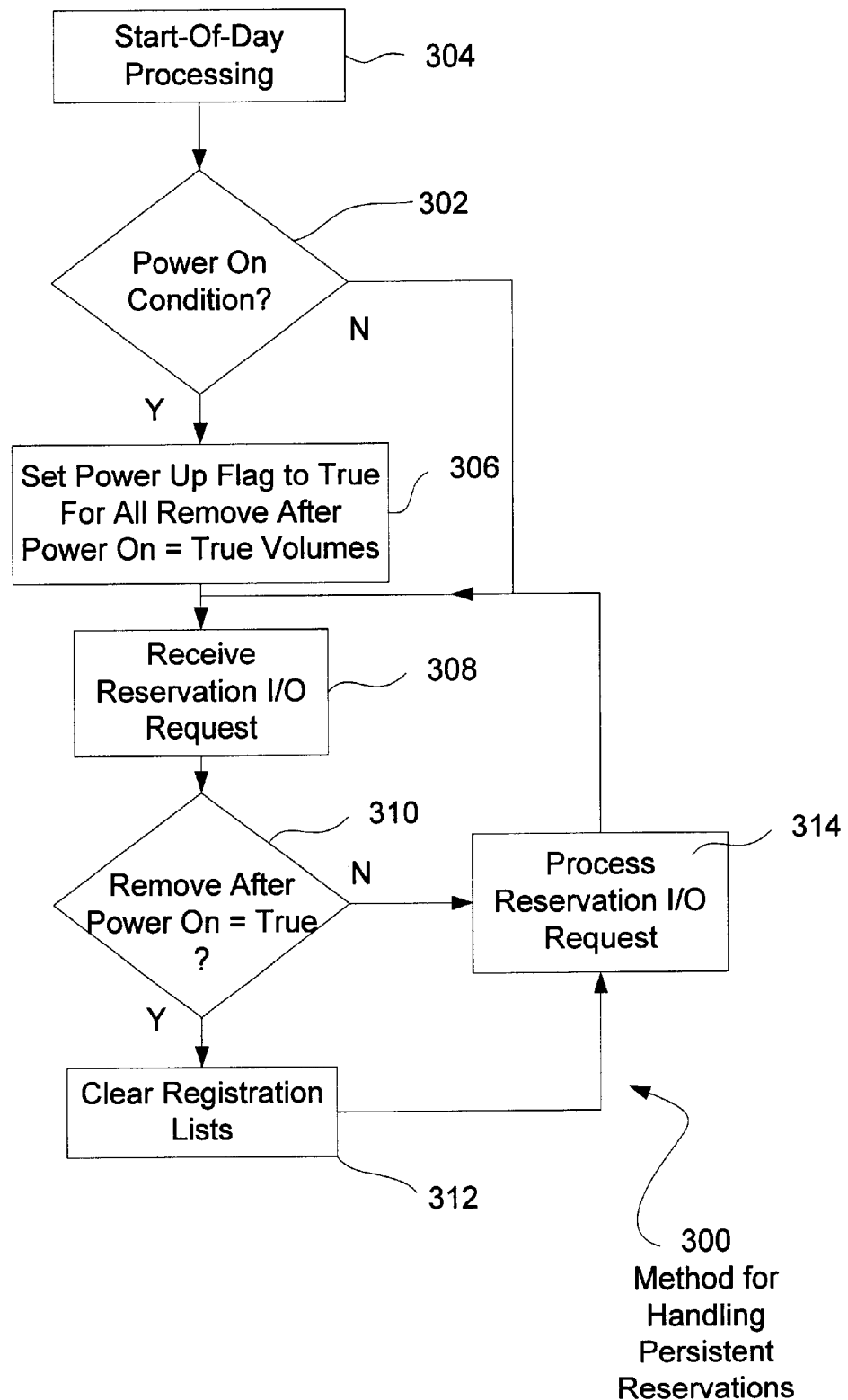
FIG. 3 is an illustration of a work flow diagram of an embodiment of the present invention wherein persistent reservations are processed.

FIG. 3 illustrates an embodiment 300 of the present invention in a work flow diagram. The start of day processing is completed in step 302. If the start of day processing was due to a power-on condition in step 304, the power up flag is set to true for all volumes where the remove after power-on bit is set to true in step 306. If the start of day processing was due to something other than a power-on condition, such as a warm restart, the step 306 is skipped. When a reservation I/O request is received in step 308 and the remove after power-on bit is set to true in step 310, the registration list is cleared in step 312 and the reservation I/O request is processed in step 314.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for processing persistent reservations after a power cycle in a computer storage device with multiple volumes comprising:

completing a power-on sequence after a power cycle;

setting the status of said storage device to receive I/O requests;

receiving a reservation I/O request for a volume of said storage device, said volume having at least one persistent reservation that is to persist through a restart but not a power cycle;

determining that a power cycle has occurred and that said reservation is not to persist after said power cycle;

performing at least some processing on said reservation; and processing said reservation I/O request.

2. The method of claim 1 wherein said power-on sequence comprises setting a power-on bit for each of said multiple volumes, said power-on bit being used to indicate if at least one registration for said volume must be deleted prior to accepting said I/O request.

3. The method of claim 1 wherein said computer storage device is a SCSI device.

4. The method of claim 1 wherein said processing on said reservation comprises deleting at least one registration.

5. A computer storage device of multiple volumes with reservations that persist after a reset but not a power cycle comprising:

a storage medium comprising multiple volumes; and a controller for said storage device adapted to completing a power-on sequence after a power cycle, setting the status of said storage device to receive I/O requests, receiving a reservation I/O request for a volume of said storage device, said volume having at least one persistent reservation that is to persist through a restart but not a power cycle, determining that a power cycle has occurred and that said reservation is not to persist after said power cycle, performing at least some processing on said reservation, and processing said reservation I/O request.

6. The computer storage device of claim 5 further comprising:

a power-on bit for each of said multiple volumes wherein said power-on bit indicates if at least one registration must be deleted prior to processing a reservation I/O request for said volume.

7. The computer storage device of claim 5 wherein said computer storage device is a SCSI device.

8. The computer storage device of claim 5 wherein said processing on said reservation comprises deleting at least one registration.

* * * * *